(12) United States Patent
Motwani

(10) Patent No.: US 10,009,043 B2
(45) Date of Patent: Jun. 26, 2018

(54) TECHNOLOGIES FOR PROVIDING EFFICIENT ERROR CORRECTION WITH HALF PRODUCT CODES

(71) Applicant: Intel Corporation, Santa Clara, CA (US)

(72) Inventor: Ravi H. Motwani, San Diego, CA (US)

(73) Assignee: Intel Corporation, Santa Clara, CA (US)

( * ) Notice: Subject to any disclaimer, the term of this patent is extended or adjusted under 35 U.S.C. 154(b) by 23 days.

(21) Appl. No.: 15/197,953

(22) Filed: Jun. 30, 2016

(65) Prior Publication Data

US 2018/0006667 A1 Jan. 4, 2018

(51) Int. Cl.
| | |
|---|---|
| H03M 13/00 | (2006.01) |
| H03M 13/29 | (2006.01) |
| H04L 29/08 | (2006.01) |
| G06F 11/10 | (2006.01) |
| H03M 13/09 | (2006.01) |
| H03M 13/15 | (2006.01) |

(52) U.S. Cl.
CPC ..... *H03M 13/2909* (2013.01); *G06F 11/1076* (2013.01); *H03M 13/09* (2013.01); *H03M 13/152* (2013.01); *H03M 13/2939* (2013.01); *H03M 13/616* (2013.01); *H04L 69/324* (2013.01)

(58) Field of Classification Search
None
See application file for complete search history.

(56) References Cited

U.S. PATENT DOCUMENTS

| | | | | |
|---|---|---|---|---|
| 8,621,318 | B1* | 12/2013 | Micheloni | G06F 11/1012 714/755 |
| 9,294,132 | B1* | 3/2016 | Peleato-Inarrea | H03M 13/2948 |
| 2014/0068379 | A1* | 3/2014 | Sakaue | G06F 11/1012 714/764 |
| 2015/0309875 | A1* | 10/2015 | Mittelholzer | G06F 11/1012 714/766 |
| 2017/0163292 | A1* | 6/2017 | Blaettler | H03M 13/2921 |

OTHER PUBLICATIONS

Emmadi et al., "Half-product codes in flash memory", Non-Volatile Memories Workshop, Mar. 2015.*

* cited by examiner

*Primary Examiner* — Daniel McMahon
(74) *Attorney, Agent, or Firm* — Barnes & Thornburg LLP

(57) ABSTRACT

Technologies for providing efficient error correction with half product codes include an apparatus having a memory to store data and a controller to manage read and write operations of the memory. The controller is to obtain, in response to a write request, data to write to the memory. The controller is further to encode the data with a half product code to define a matrix that includes at least one matrix element based on a soft decision error correction encoder algorithm and at least one other matrix element based on a hard decision error correction encoder algorithm. Additionally, the controller is to write the half product code to the memory.

23 Claims, 7 Drawing Sheets

TECHNOLOGIES FOR PROVIDING EFFICIENT ERROR CORRECTION WITH HALF PRODUCT CODES

BACKGROUND

Data storage devices typically employ error correction codes (ECCs) to encode and subsequently decode data in a manner that corrects data corruption that may have occurred during storage. Error correction codes typically fall into one of two classes, those that produce hard decision information and those that produce soft decision information. A hard decision decoding process produces output data in which each datum is one of a fixed set of values (e.g., a zero or a one in a binary code). By contrast, a soft decision decoding process produces output data in which each datum may be any value within a given range (e.g., a value between zero and one) that represents a reliability or probability that the original datum was a particular value. As an example, a value of 0.7 may indicate that the original datum was probably a one while a value of 0.2 may indicate that the original datum was probably a zero. Accordingly, soft decision decoding provides a richer information set than hard decision decoding. However, the amount of processing logic used to implement soft decision decoding is typically greater than that used to implement hard decision decoding, especially as the size of the data block to be encoded or decoded increases.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
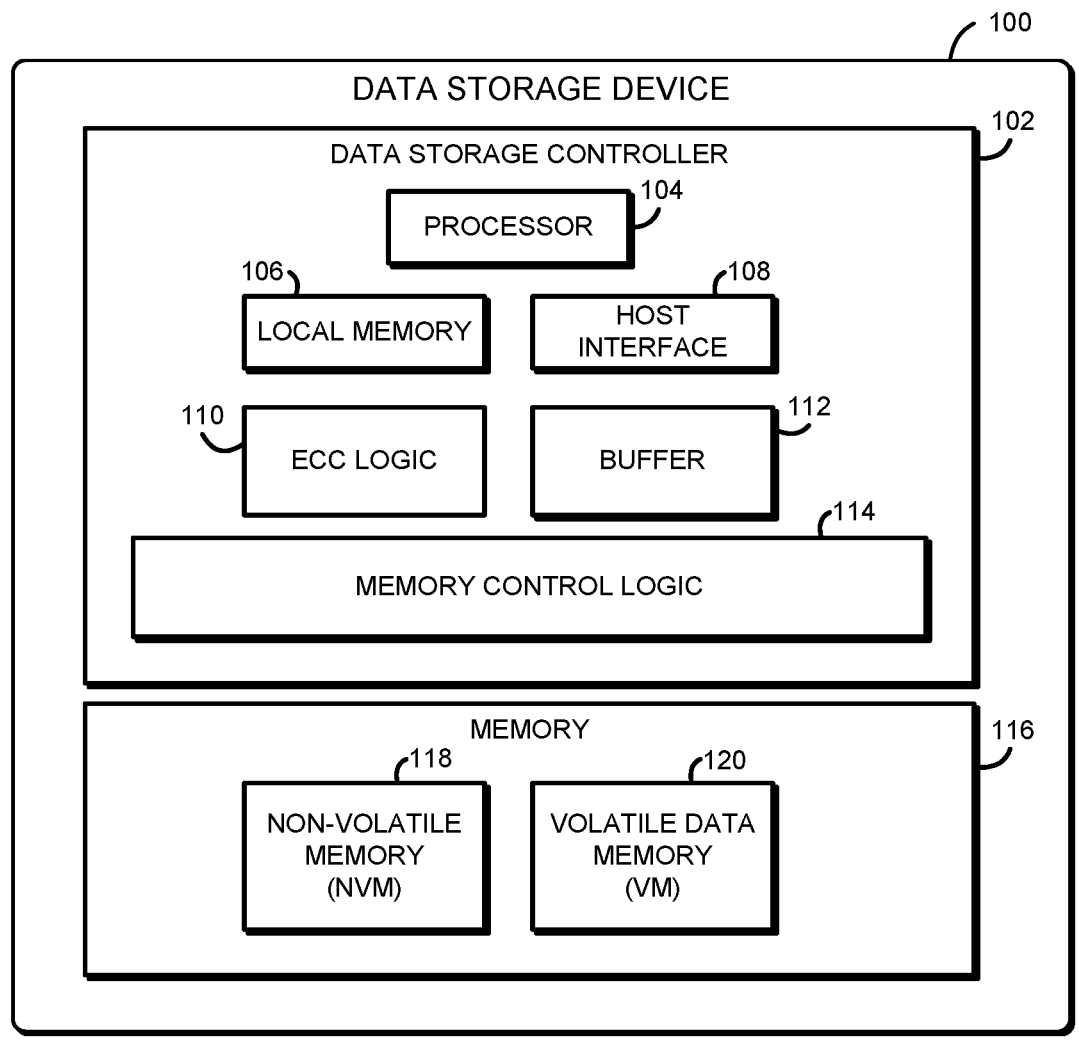
FIG. 1 is a simplified block diagram of at least one embodiment of a data storage device that includes a data storage controller for encoding and decoding data with half product codes.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

As shown in FIG. 1, an illustrative data storage device 100 for encoding and decoding data with half product codes includes a data storage controller 102 and a memory 116, which illustratively includes non-volatile memory 118 and volatile memory 120. As discussed in more detail below, during use, the data storage controller 102 is configured to encode data using a half product code that defines a matrix. The data storage controller 102 is configured to convolutionally encode some rows and columns using a soft decision encoder algorithm, such as a convolutional encoder algorithm, and encode other rows and columns of the matrix with a hard decision encoder algorithm, such as a Bose, Chaudhuri, and Hocquenghem (BCH) encoder algorithm. By using a combination of soft encoding and hard encoding to produce the half product code, the data storage controller 102 may subsequently decode both the soft decision encoded portion and the hard decision encoded portion with soft decision decoder algorithms. For example, the data storage controller 102 may use a soft output Viterbi algorithm (SOYA) to decode the convolutionally encoded portion and may use a Chase decoder algorithm to decode the BCH encoded section, using soft decision information that was produced from the SOYA decoder algorithm. By using this combination of soft decision encoding and hard decision encoding in a half product code, the data storage controller 102 may obtain the more precise and accurate data reconstruction afforded by soft decision encoding and decoding, without the additional logic overhead typically associated with soft decision technologies, such as low-density parity check (LDPC) technologies.

The data storage device 100 may be embodied as any type device capable of storing data and performing the functions described herein. In the illustrative embodiment, the data storage device 100 is embodied as a solid state drive; however, in other embodiments, the data storage device 100 may embodied as a hard disk drive, a memory module device, a cache memory device, and/or other data storage device.

The data storage controller 102 of the data storage device 100 may be embodied as any type of control device, circuitry, or collection of hardware devices capable of encoding and decoding data with half product codes that are based on a combination of soft decision algorithms and hard decision algorithms. In the illustrative embodiment, the data storage controller 102 includes a processor or processing circuitry 104, local memory 106, a host interface 108, ECC logic, a buffer 112, and memory control logic (also referred to herein as a "memory controller") 114. The memory controller 114 can be in the same die or integrated circuit as the processor 104 or the memory 106, 116 or in a separate die or integrated circuit than those of the processor 104 and the memory 106, 116. In some cases, the processor 104, the memory controller 114, and the memory 106, 116 can be implemented in a single die or integrated circuit. Of course, the data storage controller 102 may include additional devices, circuits, and/or components commonly found in a drive controller of a solid state drive in other embodiments.

The processor 104 may be embodied as any type of processor capable of performing the functions described herein. For example, the processor 104 may be embodied as a single or multi-core processor(s), digital signal processor, microcontroller, or other processor or processing/controlling circuit. Similarly, the local memory 106 may be embodied as any type of volatile and/or non-volatile memory or data storage capable of performing the functions described herein. In the illustrative embodiment, the local memory 106 stores firmware and/or other instructions executable by the processor 104 to perform the described functions of the data storage controller 102. In some embodiments, the processor 104 and the local memory 106 may form a portion of a System-on-a-Chip (SoC) and be incorporated, along with other components of the data storage controller 102, onto a single integrated circuit chip.

The host interface 108 may also be embodied as any type of hardware processor, processing circuitry, input/output circuitry, and/or collection of components capable of facilitating communication of the data storage device 100 with a host device or service (e.g., a host application). That is, the host interface 108 embodies or establishes an interface for accessing data stored on the data storage device 100 (e.g., stored in the memory 116). To do so, the host interface 108 may be configured to utilize any suitable communication protocol and/or technology to facilitate communications with the data storage device 100 depending on the type of data storage device. For example, the host interface 108 may be configured to communicate with a host device or service using Serial Advanced Technology Attachment (SATA), Peripheral Component Interconnect express (PCIe), Serial Attached SCSI (SAS), Universal Serial Bus (USB), and/or other communication protocol and/or technology in some embodiments.

The ECC logic 110 may be embodied as any device capable of performing operations to encode and decode data using error correction code algorithms, at the request of the processor 104. As such, the ECC logic 110 may be embodied as an application specific integrated circuit (ASIC), a field programmable gate array (FPGA), a dedicated microprocessor, or other hardware logic devices/circuitry. In some embodiments, the ECC logic 110 is incorporated into the processor rather than being a discrete component.

The buffer 112 of the data storage controller 102 is embodied as volatile memory used by data storage controller 102 to temporarily store data that is being read from or written to the memory 116. The particular size of the buffer 112 may be dependent on the total storage size of the memory 116. The memory control logic 114 is illustratively embodied as hardware circuitry and/or device configured to control the read/write access to data at particular storage locations of memory 116.

The non-volatile memory 118 may be embodied as any type of data storage capable of storing data in a persistent manner (even if power is interrupted to non-volatile memory 118). For example, in the illustrative embodiment, the non-volatile memory 118 is embodied as one or more non-volatile memory devices. The non-volatile memory devices of the non-volatile memory 118 are illustratively embodied as quad level cell (QLC) NAND Flash memory. However, in other embodiments, the non-volatile memory 118 may be embodied as any combination of memory devices that use chalcogenide phase change material (e.g., chalcogenide glass), three-dimensional (3D) crosspoint memory, or other types of byte-addressable, write-in-place non-volatile memory, ferroelectric transistor random-access memory (FeTRAM), nanowire-based non-volatile memory, phase change memory (PCM), memory that incorporates memristor technology, Magnetoresistive random-access memory (MRAM) or Spin Transfer Torque (STT)-MRAM.

The volatile memory 120 may be embodied as any type of data storage capable of storing data while power is supplied volatile memory 120. For example, in the illustrative embodiment, the volatile memory 120 is embodied as one or more volatile memory devices, and is periodically referred to hereinafter as volatile memory 120 with the understanding that the volatile memory 120 may be embodied as other types of non-persistent data storage in other embodiments. The volatile memory devices of the volatile memory 120 are illustratively embodied as dynamic random-access memory (DRAM) devices, but may be embodied as other types of volatile memory devices and/or memory technologies capable of storing data while power is supplied to the volatile memory 120.

Figure 2:
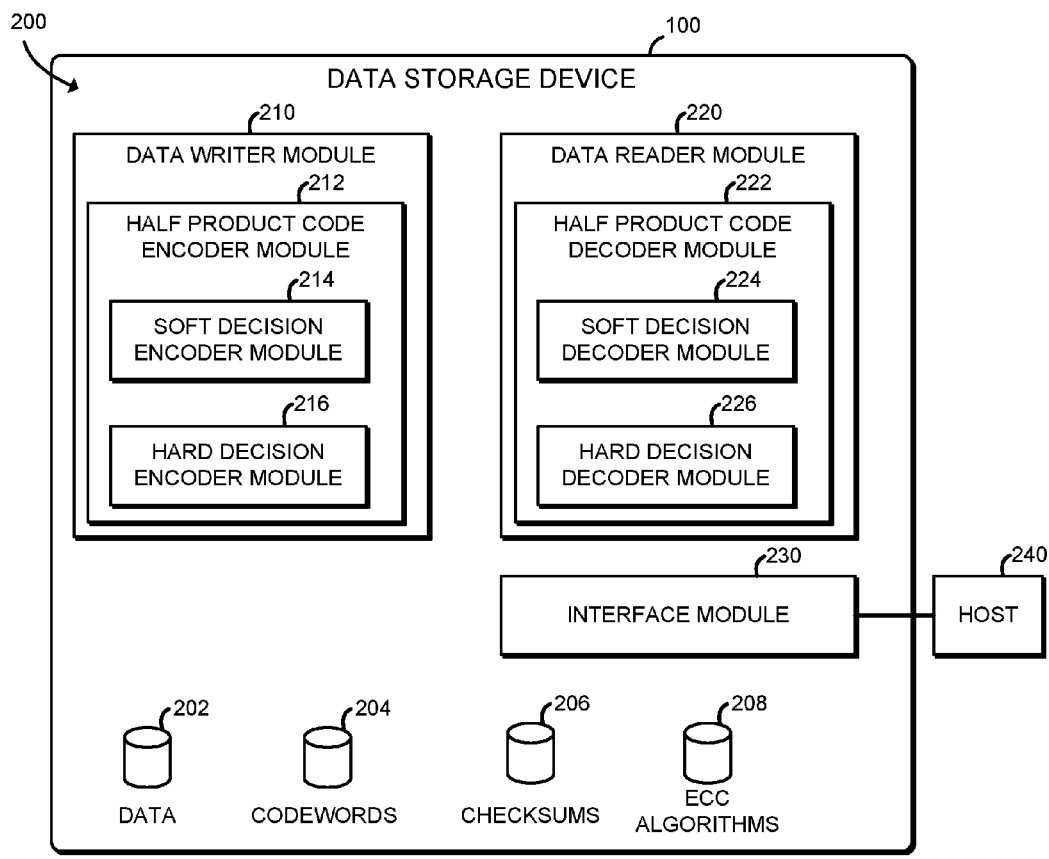
FIG. 2 is a simplified block diagram of at least one embodiment of an environment that may be established by the data storage device of FIG. 1.

Referring now to FIG. 2, in use, the data storage controller 102 of the data storage device 100 may establish an environment 200. The illustrative environment 200 includes a data writer module 210, a data reader module 220, and an interface module 230. Each of the modules and other components of the environment 200 may be embodied as firmware, software, hardware, or a combination thereof. For example the various modules, logic, and other components of the environment 200 may form a portion of, or otherwise be established by, the data storage controller 102 or other hardware components of the data storage device 100. As such, in some embodiments, any one or more of the modules of the environment 200 may be embodied as a circuit or collection of electrical devices (e.g., a data writer circuit 210, a data reader circuit 220, an interface circuit 230, etc.). In the illustrative environment 200, the environment 200 includes data 202, such as data to be written to the nonvolatile memory 118 and data that has been read (i.e., reconstructed) from the non-volatile memory 118, codewords 204 representing an encoded form of the data 202, checksums 206 which may be embodied as relatively small sized sets of data representative of a signature (e.g., a result of a hashing function) of larger sets of data, and error correction code (ECC) algorithms that define mathematical operations for encoding and decoding the data 202, each of which may be accessed by the various modules and/or sub-modules of the data storage controller 102.

In the illustrative embodiment, the data writer module 210, which may be embodied as hardware, firmware, software, virtualized hardware, emulated architecture, and/or a combination thereof as discussed above, is configured to encode data received from the host 240 using a half product code that employs a combination of soft decision encoding and hard decision encoding, and write the encoded data (i.e., the half product code) to the memory 116 (e.g., the non-volatile memory 118). To do so, in the illustrative embodiment, the data writer module 210 includes a half product code encoder module 212. The half product code encoder module 212 is configured to encode the data with a half product code that defines a matrix in which at least one matrix element (e.g., a row or column) is based on a soft decision error correction encoder algorithm 208 and at least one other matrix element (e.g., a different row or column) is based on a hard decision error correction encoder algorithm 208. In the illustrative embodiment, the half product code encoder module 212 is configured to encode the data with a half product code in which the encoding type for a given row is the same as the encoding type for the corresponding column. For example, if the first column is convolutionally encoded, then the first row is also convolutionally encoded. Likewise, if the second column is BCH encoded, then the second row is also BCH encoded. This encoding scheme maintains symmetry in the half product code. Half product codes are preferred over full product codes because they utilize a reduced product code block length while providing the same component codes.

In the illustrative embodiment, the half product code encoder module 212 includes a soft decision encoder module 214 and a hard decision encoder module 216. The soft decision encoder module 214 is configured to encode rows and columns of the half product code with a soft decision encoder algorithm, such as convolutional encoding. The hard decision encoder module 216 is configured to encode other rows and columns of the half product code with a hard decision encoder algorithm, such as a BCH encoder algorithm. In the illustrative embodiment, the soft decision encoder module 214 is configured to use a convolutional encoding algorithm with an input rate parameter of 16, an output rate parameter of 17, a free distance of three, and a memory parameter of five. Additionally, in the illustrative embodiment, the hard decision encoder module 216 is configured to use a BCH encoding algorithm with an n parameter (i.e., number of output values) of 546, a k parameter (i.e., number of input values) of 515, and a t parameter of three. The illustrative data writer module 210 is configured to perform continuous convolutional encoding, meaning that all of the rows to be encoded with convolutional encoding are encoded consecutively with no trellis termination until the last row is encoded. In some embodiments, the data writer module 210 is configured to perform tail-biting convolutional encoding, to ensure that a starting state of the convolutional encoder is the same as its ending state. This is a technique of trellis termination that avoids the rate loss incurred by zero-tail termination and reduces overhead bits. Further, the data writer module 210 may be configured to determine and store a checksum 206, such as a cyclic redundancy check (CRC) checksum, for each data block to be encoded, for use in performing a list decoding of the data.

It should be appreciated that each of the half product code encoder module 212, the soft decision encoder module 214, and the hard decision encoder module 216 may be separately embodied as hardware, firmware, software, virtualized hardware, emulated architecture, and/or a combination thereof. For example, the half product code encoder module 212 may be embodied as a hardware component, while the soft decision encoder module 214 and the hard decision encoder module 216 are embodied as virtualized hardware components or as some other combination of hardware, firmware, software, virtualized hardware, emulated architecture, and/or a combination thereof.

In the illustrative embodiment, the data reader module 220, which may be embodied as hardware, firmware, software, virtualized hardware, emulated architecture, and/or a combination thereof as discussed above, is configured to read codewords (e.g., half product codes) from the memory 116 and decode them to provide requested data the host 240. To do so, the data reader module 220 includes a half product code decoder module 222. The half product code decoder module 222 is configured to decode a half product code to reconstruct data contained therein. In the illustrative embodiment, the half product code is based on a combination of soft decision encoded data and hard decision encoded data. Accordingly, in the illustrative embodiment, the half product code decoder module 222 includes a soft decision decoder module 224. The half product code decoder module 222 may also include a hard decision decoder module 226. The soft decision decoder module 224 is configured to decode the portion of the half product code that was encoded with a soft decision encoder algorithm (e.g., a convolutional encoder algorithm). Further, the hard decision decoder module 226 may be configured to decode data in the half product code that was encoded with a hard decision encoder algorithm (e.g., BCH). In the illustrative embodiment, the half product code decoder module 222 is configured to utilize the soft decision decoder module 224 to decode the soft decision encoded portion of the half product code with a SOYA decoder algorithm and then decode the BCH encoded portion with a Chase decoder algorithm that utilizes soft information generated by the SOYA decoder algorithm. By doing so, the BCH encoded portion may provide soft decision information, even though it was encoded using a hard decision encoder algorithm. In some embodiments, the data reader module 220 is configured to perform a list decode, in which the data reader module 220 is to produce multiple potential reconstructed versions of the data from the half product code, compare each version to a cyclic redundancy check (CRC) checksum 206 stored in association with the data, determine which version has the least number of flipped (i.e., erroneous bits) based on the comparison to the checksum 206, and select that version as the reconstruction of the data.

It should be appreciated that each of the half product code decoder module 222, the soft decision decoder module 224, and the hard decision decoder module 226 may be separately embodied as hardware, firmware, software, virtualized hardware, emulated architecture, and/or a combination thereof. For example, the half product code decoder module 222 may be embodied as a hardware component, while the soft decision decoder module 224 and the hard decision decoder module 226 are embodied as virtualized hardware components or as some other combination of hardware, firmware, software, virtualized hardware, emulated architecture, and/or a combination thereof.

The interface module 230, which may be embodied as hardware, firmware, software, virtualized hardware, emulated architecture, and/or a combination thereof as discussed above, is configured to handle write requests and read requests received from a host 240, which may be embodied as an application, service, and/or other device. To do so, the interface module 230 may be configured to identify a received request and any data or parameters associated with the request, and transmit these items to the data writer module 210 or the data reader module 220, depending on the type of request. In response to a write request, the interface module 230 may be configured to transmit a result of the request to the host 240, for example a confirmation that the write request was received and/or completed. In response to a read request, the interface module 234 may be configured to transmit the data read (i.e., the data from the half product code in memory 116) by the data reader module 220 to the host 240.

Figure 3:
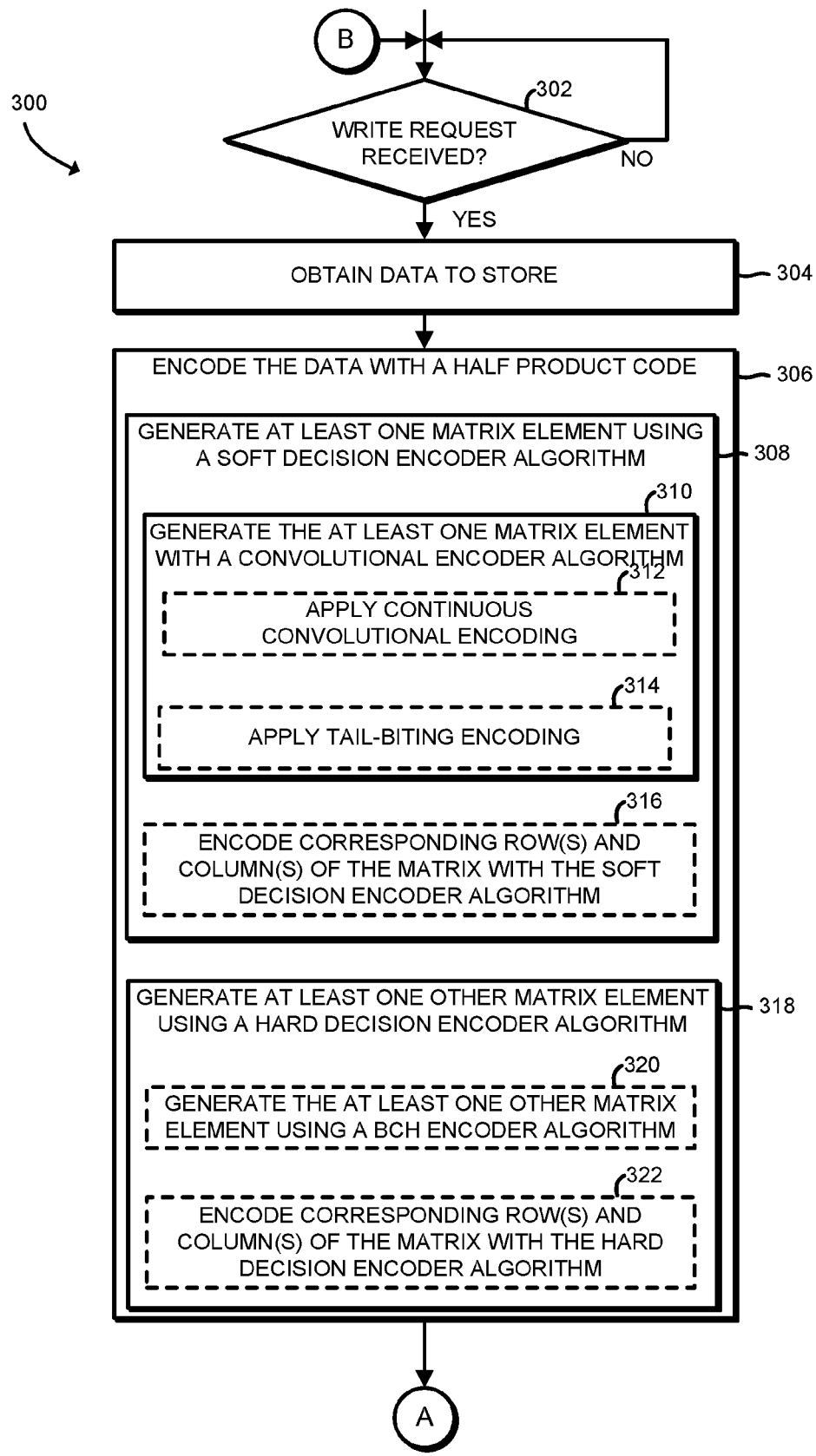
FIGS. 3 and 4 are a simplified flow diagram of at least one embodiment of a method for encoding data that may be executed by the data storage device of FIG. 1.

Referring now to FIG. 3, in use, the data storage controller 102 of the data storage device 100 may execute a method 300 for encoding data for storage in the memory 116. The method 300 begins with block 302 in which the data storage controller 102 determines whether a write request has been received (e.g., from the host 240). If a write request has been received, the method 300 advances to block 304. In block 304, the data storage controller 102 obtains the data to store to the memory 116. In some embodiments, the write instruction may include a memory address of the data, and the data storage controller 102 accesses the data using the address. In some embodiments, the block of data is 16 kilobytes. In other embodiments, the block of data is another size. In block 306, the data storage controller 102 encodes the obtained data with a half product code. In doing so, in the illustrative embodiment, the data storage controller 102 generates at least one matrix element (e.g., rows and/or columns) using a soft decision encoder algorithm, as indicated in block 306. Moreover, in the illustrative embodiment, in generating the matrix element using a soft decision encoder algorithm, the data storage controller 102 generates the matrix element with a convolutional encoder, as indicated in block 310. As described above, a soft encoder algorithm enables soft information to be obtained during a decoding process. The soft information provides probability or reliability information about the likelihood that a decoded datum was a particular value when it was previously stored. A convolutional code is type of soft decision encoding type that generates parity symbols by applying a sliding Boolean polynomial function to input data. The input data is treated as a data stream. The sliding application of the Boolean polynomial represents the convolution of the encoder over the input data.

As indicated in block 312, in the illustrative embodiment, the data storage controller 102 applies continuous convolution encoding, meaning the data storage controller 102 does not terminate a trellis until it has encoded all of the portions (e.g., rows) that have been designated to be soft decision encoded. As will be understood by those skilled in the art, a trellis is a graph having nodes that are representative of encoded states of a given data set. The nodes are ordered into slices that are representative of time. Each node for a given time slice is connected to at least one node associated with an earlier or later time. Continuous convolutional encoding provides enhanced efficiency by reducing overhead associated with trellis termination. As indicated in block 314, the data storage controller 102 may perform tail-biting encoding to ensure that a starting state of the convolutional encoder is the same as its ending state. This is a technique of trellis termination that avoids rate loss typically incurred by zero-tail termination and it reduces overhead bits. As indicated in block 316, to maintain symmetry in the half product code, the data storage controller 102 may encode corresponding rows and columns of the matrix with the soft decision encoder algorithm. For example, if the data storage controller 102 encodes the first column with the convolutional encoder algorithm, the data storage controller 102 also encodes the first row with the convolutional encoder algorithm.

In block 318, the data storage controller 102 generates at least one other matrix element (e.g., other rows and/or columns) using a hard decision encoder algorithm. As described above, a hard decision encoder algorithm is configured to produce a codeword that, when decoded, provides discrete values for each encoded datum, such as a one or a zero, rather than providing values in a range between one and zero. As such, hard decision encoder algorithms, such as BCH, typically require less logic overhead than soft decision encoder algorithms. As indicated in block 320, in the illustrative embodiment, the data storage controller 102 encodes the elements of the matrix using a BCH encoder algorithm. Further, in the illustrative embodiment, to maintain symmetry of the half product code, the data storage controller 102 encodes corresponding rows and columns with the same hard decision encoder algorithm. For example, if the data storage controller 102 encodes the second column with BCH, the data storage controller also encodes the second row with BCH.

Figure 4:
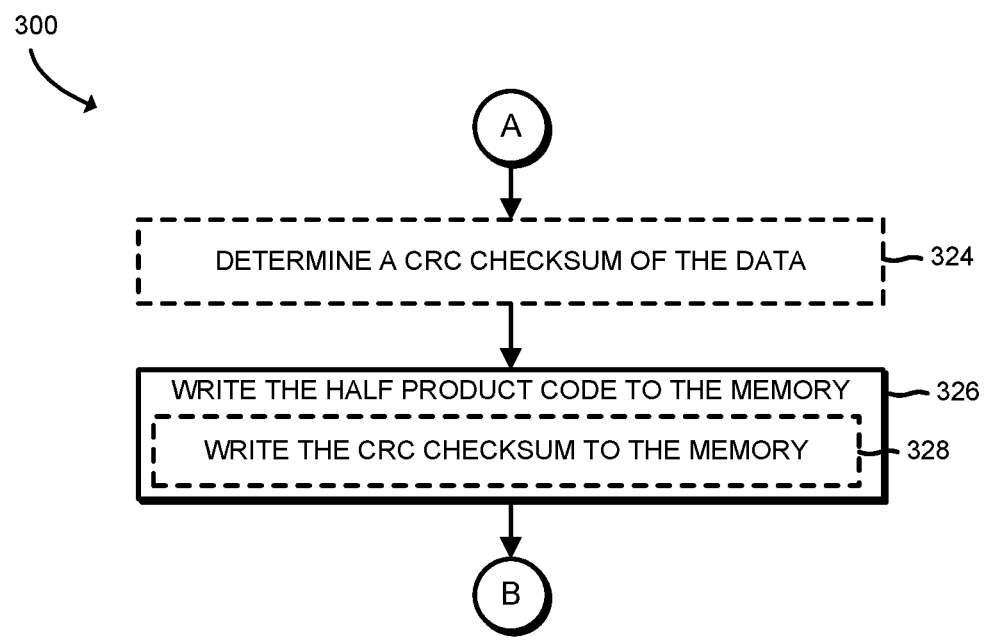

After encoding the data with a half product code, the method 300 advances to block 324 of FIG. 4. In block 324, the data storage controller 102 may determine a checksum, such as a CRC checksum, of the data. In block 326, the data storage controller 102 writes the half product code to the memory 116, such as the non-volatile memory 118. In doing so, the data storage controller 102 may write the CRC checksum from block 324 to the memory 116 (e.g., the non-volatile memory 118), as indicated in block 328. Subsequently, the method 300 loops back to block 302, in which the data storage controller 102 awaits another write request.

Figure 5:
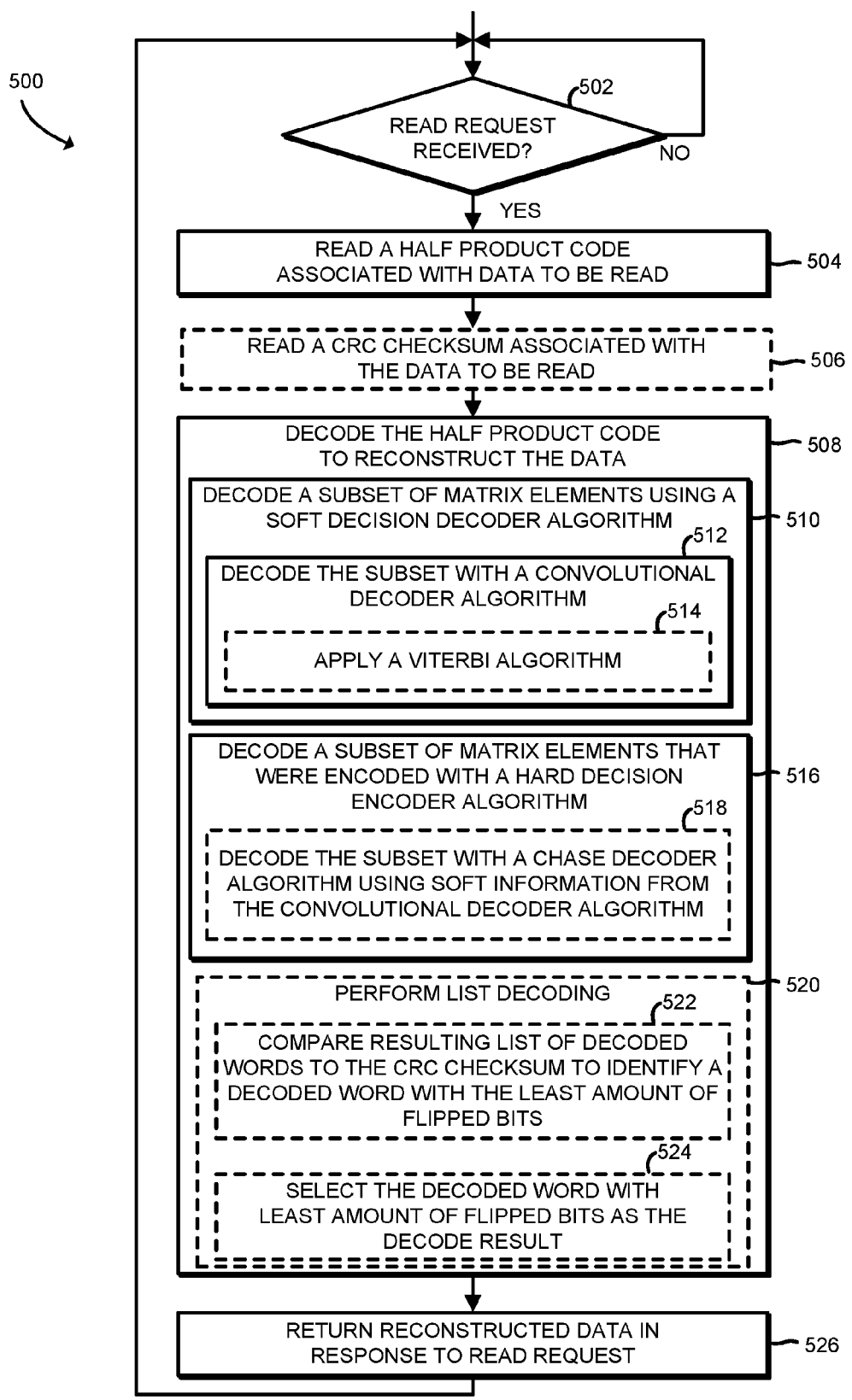
FIG. 5 is a simplified flow diagram of at least one embodiment of a method for decoding data may be executed by the data storage device of FIG. 1.

Referring now to FIG. 5, in use, the data storage controller 102 may perform a method 500 of decoding data in response to a read request. The method 500 begins with block 502 in which the data storage controller 102 determines whether a read request has been received from the host 240. If so, the method 500 advances to block 504 in which the data storage controller 102 reads a half product code associated with the data to be read. For example, the read request may specify a logical address that the data storage controller 102 then translates to a physical address in the non-volatile memory 118, and reads the half product code (i.e., codeword 204) stored at that physical address. As indicated in block 506, the data storage controller 102 may additionally read a CRC checksum 206 that was previously stored in association with the data. The CRC checksum 206 may be located at an address in the non-volatile memory 118 that is logically or physically adjacent to the data to be reconstructed, or may be at another location in the non-volatile memory 118.

In block 508, the data storage controller 102 decodes the half product code that was read from the memory 116, to reconstruct the data encoded therein. In doing so, as indicated in block 510, the data storage controller 102 may decode a subset of matrix elements (i.e., rows and columns) using a soft decision encoder algorithm, as indicated in block 510. In the illustrative embodiment, the data storage controller 102 decodes the subset with a convolutional decoder algorithm, as indicated in block 512. In doing so, the data storage controller 102 may apply a Viterbi algorithm, such as the soft output Virterbi algorithm (SOVA), as indicated in block 514. In block 516, the data storage controller 102 decodes a subset of the matrix elements (e.g., rows and columns) that were encoded with a hard decision encoder algorithm, such as the BCH encoder algorithm, as described above with reference to the method 300. In the illustrative embodiment, as indicated in block 518, the data storage controller 102 decodes the subset with a Chase decoder algorithm using soft decision information produced from the convolutional decoder algorithm described in blocks 512 and 514. By doing so, the data storage controller 102 may obtain soft decision information (i.e., reliability or probability information) from the subset of the matrix that was encoded with the hard decision encoder algorithm, thereby enhancing the accuracy and precision of the reconstructed data. As indicated in block 520, in decoding the half product code to reconstruct the data, the data storage controller 102 may perform a list decoding of the half product code. In performing a list decoding, the data storage controller 102 may produce a list of different possible reconstructions of the data (i.e., decoded words), and then compare each decoded word to the CRC checksum that was read in block 506, to identify a decoded word in the list with the lowest number of flipped (i.e., corrupted) bits. The data storage controller 102 may then select that decoded word as the result of the decoding (i.e., the reconstructed data), as indicated in block 524. In block 526, the data storage controller 102 returns the reconstructed data to the host 240 in response to the read request and the method 500 loops back to block 502, in which the data storage controller 102 awaits another read request.

Figure 6:
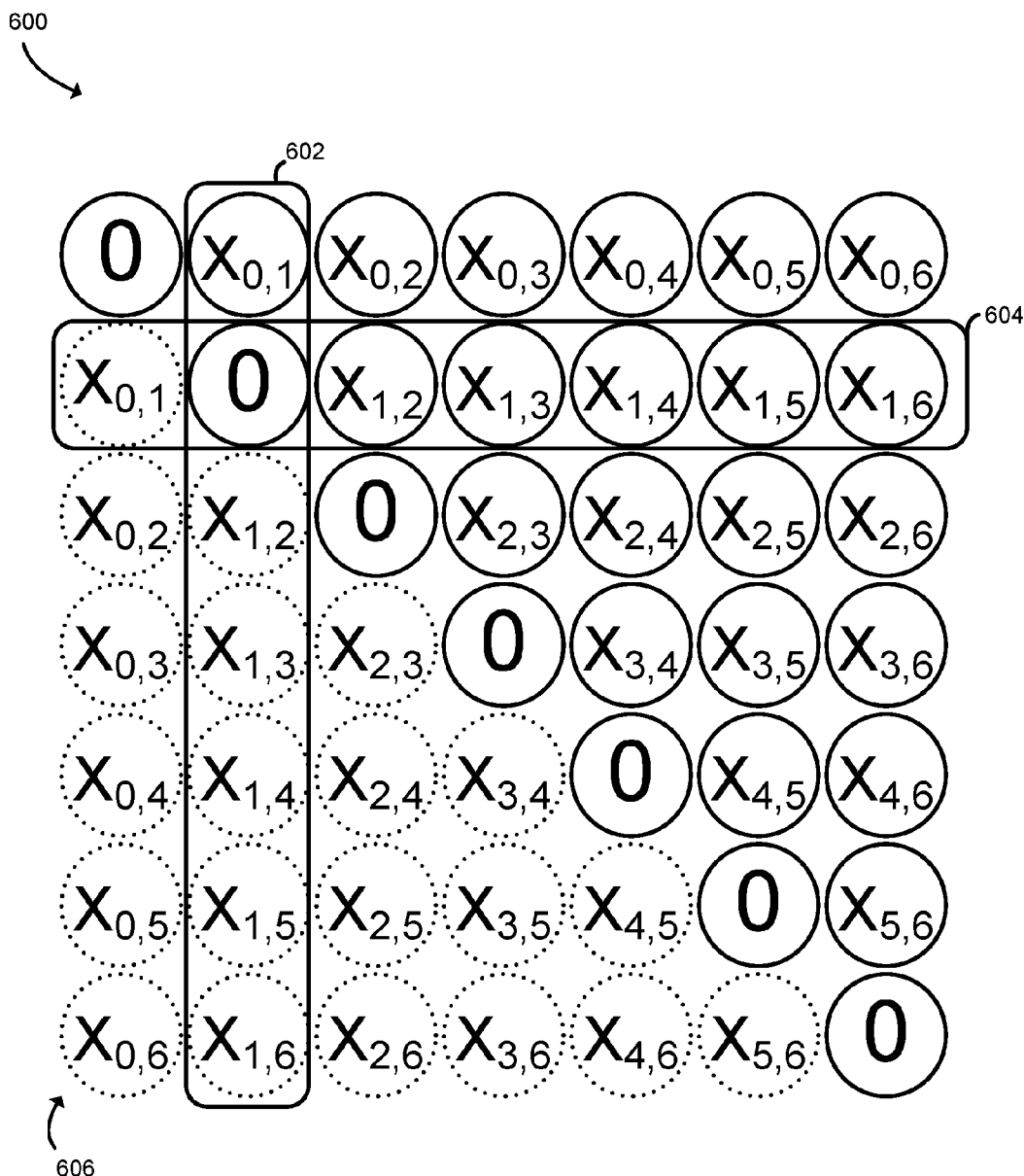
FIG. 6 is a simplified diagram of at least one embodiment of a half product code used by the data storage device of FIG. 1 to encode data.

Referring now to FIG. 6, a half product code 600 generated by the data storage controller 102 defines a matrix of rows and columns. As described above, in the illustrative embodiment, the data storage controller 102 is configured to encode some of the rows and columns using a soft decision encoder algorithm, such as a convolutional encoder algorithm, and to encode other rows and columns using a hard decision encoder algorithm, such as a BCH encoder algorithm. However, to maintain the symmetry of the half product code, the data storage controller 102 is configured to encode corresponding columns and rows with the same encoder algorithm. For example, the data storage controller 102 may be configured to encode the second column 602 and the corresponding second row 604, with the BCH encoder algorithm Maintaining the symmetry enables the section of values 606, which are shown with dotted borders, to be not included in the half product code, thereby transforming what would otherwise be a product code into the half product code 600. A half product code is preferable over a product code because it occupies less storage space while maintaining the information necessary to decode the data.

Figure 7:
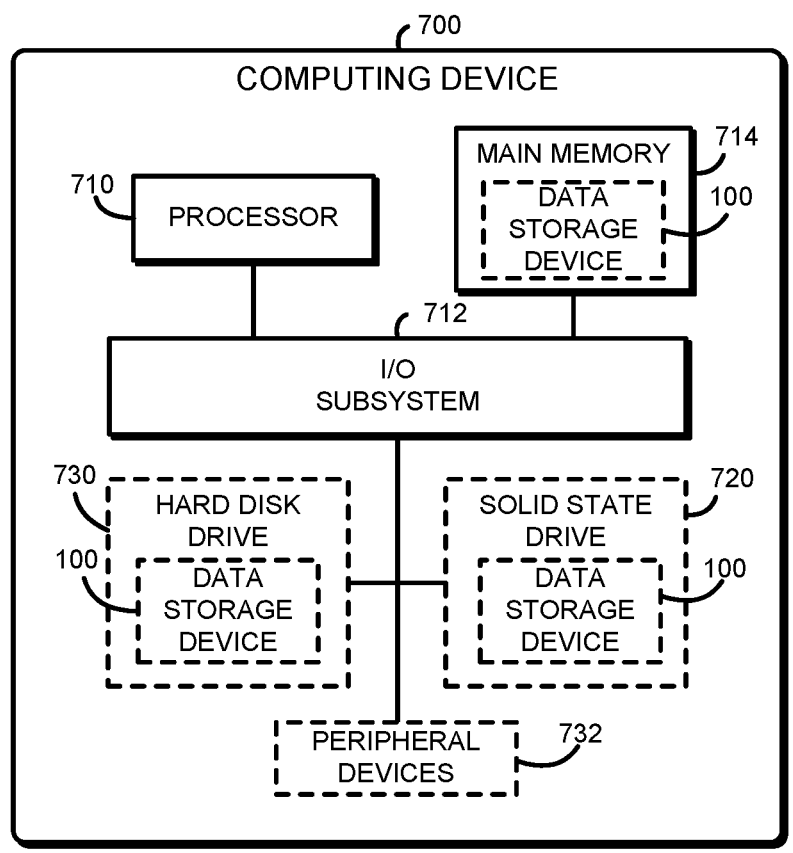
FIG. 7 is a simplified block diagram of at least one embodiment of a computing device including the data storage device of FIG. 1.

Referring now to FIG. 7, in some embodiments, the data storage device 100 may be incorporated in, or form a portion of, a computing device or other apparatus 700. The computing device 700 may be embodied as any type of computing device in which the data storage device 100 may be used. For example, the computing device 700 may be embodied as a smart phone, a tablet computer, a notebook, a laptop computer, a netbook, an Ultrabook™, a wearable computing device, a pair of smart glasses, a head-mounted computing device, a cellular phone, a desktop computer, a smart device, a personal digital assistant, a mobile Internet device, a server, a data storage device, and/or any other computing/communication device. As shown in FIG. 7, the illustrative computing device 700 includes a processor 710, an input/output ("I/O") subsystem 712, and a main memory 714. Of course, the computing device 700 may include other or additional components, such as those commonly found in a typical computing device (e.g., various input/output devices and/or other components), in other embodiments. Additionally, in some embodiments, one or more of the illustrative components may be incorporated in, or otherwise form a portion of, another component. For example, the memory 714, or portions thereof, may be incorporated in the processor 710 in some embodiments.

The processor 710 may be embodied as any type of processor capable of performing the functions described herein. For example, the processor 710 may be embodied as a single or multi-core processor(s), digital signal processor, microcontroller, or other processor or processing/controlling circuit. Similarly, the memory 714 may be embodied as any type of volatile or non-volatile memory or data storage capable of performing the functions described herein. In operation, the memory 714 may store various data and software used during operation of the computing device 700 such as operating systems, applications, programs, libraries, and drivers. The memory 714 is communicatively coupled to the processor 710 via the I/O subsystem 712, which may be embodied as circuitry and/or components to facilitate input/output operations with the processor 710, the memory 714, and other components of the computing device 700. For example, the I/O subsystem 712 may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations.

As shown in FIG. 7, the data storage device 100 may be incorporated in, or form a portion of, one or more other components of the computing device 700. For example, the data storage device 100 may be embodied as, or otherwise be included in, the main memory 714. Additionally or alternatively, the data storage device 100 may be embodied as, or otherwise included in, a solid state drive 720 of the computing device 700. Further, in some embodiments, the data storage device 100 may be embodied as, or otherwise included in, a hard disk drive 730 of the computing device 700. Of course, in other embodiments, the data storage device 100 may be included in or form a portion of other components of the computing device 700.

Reference to memory devices can apply to different memory types, and in particular, any memory that has a bank group architecture. Memory devices generally refer to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (DDR version 4, initial specification published in September 2012 by JEDEC), DDR4E (in development by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), HBM2 (HBM version 2), currently in discussion by JEDEC), and/or others, and technologies based on derivatives or extensions of such specifications.

In addition to, or alternatively to, volatile memory, in one embodiment, reference to memory devices can refer to a nonvolatile memory device whose state is determinate even if power is interrupted to the device.

EXAMPLES

Illustrative examples of the technologies disclosed herein are provided below. An embodiment of the technologies may include any one or more, and any combination of, the examples described below.

Example 1 includes an apparatus comprising a memory to store data; and a controller to manage read and write operations of the memory, wherein the controller is to obtain, in response to a write request, data to write to the memory; encode the data with a half product code to define a matrix that includes at least one matrix element based on a soft decision error correction encoder algorithm and at least one other matrix element based on a hard decision error correction encoder algorithm; and write the half product code to the memory.

Example 2 includes the subject matter of Example 1, and wherein to encode the data with a half product code that includes at least one matrix element based on a soft decision error correction encoder algorithm comprises to generate the at least one matrix element with a convolutional code.

Example 3 includes the subject matter of any of Examples 1 and 2, and wherein to generate the at least one matrix element with a convolutional code comprises to perform a continuous convolutional encode over a plurality of rows of the matrix without termination of a trellis until a last row of the plurality of rows is encoded.

Example 4 includes the subject matter of any of Examples 1-3, and wherein to generate the at least one matrix element with a convolutional code comprises to perform a tail-biting convolutional encode of the data.

Example 5 includes the subject matter of any of Examples 1-4, and wherein to encode the data with a half product code that includes at least one matrix element based on a soft decision error correction encoder algorithm comprises to encode associated rows and columns of the matrix with the soft decision error correction encoder algorithm.

Example 6 includes the subject matter of any of Examples 1-5, and wherein to encode the data with a half product code that includes at least one other matrix element based on a hard decision error correction encoder algorithm comprises to generate the at least one other matrix element with a BCH encoder algorithm.

Example 7 includes the subject matter of any of Examples 1-6, and wherein to encode the data with a half product code that includes at least one matrix element based on a hard decision error correction encoder algorithm comprises to encode associated rows and columns of the matrix with the hard decision error correction encoder algorithm.

Example 8 includes the subject matter of any of Examples 1-7, and wherein the controller is further to determine a cyclic redundancy check (CRC) checksum of the data; and write the CRC checksum to the memory in association with the data.

Example 9 includes the subject matter of any of Examples 1-8, and wherein the controller is further to receive a read request for the data; read, in response to the request, the half product code from the memory; and decode the half product code to reconstruct the data.

Example 10 includes the subject matter of any of Examples 1-9, and wherein to decode the half product code comprises to decode a first subset of the matrix with a soft decision decoder algorithm; and decode a second subset of the matrix that was encoded with a hard decision encoder algorithm.

Example 11 includes the subject matter of any of Examples 1-10, and wherein to decode the first subset of the matrix with a soft decision decoder algorithm comprises to decode the first subset with a Viterbi algorithm.

Example 12 includes the subject matter of any of Examples 1-11, and wherein to decode the second subset of the matrix comprises to decode the second subset with a Chase decoder algorithm with soft information from the Viterbi algorithm as an input.

Example 13 includes the subject matter of any of Examples 1-12, and wherein to decode the half product code comprises to perform a list decode to generate a plurality of decoded words; compare each of the plurality of decoded words to a CRC checksum stored in association with the data to determine which of plurality of decoded words has the least amount of flipped bits; and select the decoded word with the least amount of flipped bits as the result of the decode.

Example 14 includes the subject matter of any of Examples 1-13, and wherein to encode the data with a half product code that includes at least one other matrix element based on a hard decision error correction encoder algorithm comprises to generate the at least one other matrix element with a BCH encoder algorithm with a t value of 3.

Example 15 includes the subject matter of any of Examples 1-14, and wherein to encode the data with a half product code that includes at least one other matrix element based on a soft decision error correction encoder algorithm comprises to generate the at least one other matrix element with a convolutional encoder algorithm with an input rate parameter of 16, an output rate parameter of 17, a free distance of 3, and a memory of 5.

Example 16 includes the subject matter of any of Examples 1-15, and wherein to encode the data comprises to encode a 16 kilobyte block of data.

Example 17 includes the subject matter of any of Examples 1-16, and wherein the apparatus further comprises one or more of at least one processor communicatively coupled to the memory, a network interface communicatively coupled to a processor, a display communicatively coupled to a processor, or a battery coupled to the apparatus.

Example 18 includes a method comprising obtaining, by a controller of an apparatus, data to write to a memory of the apparatus; encoding, by the controller, the data with a half product code to define a matrix that includes at least one matrix element based on a soft decision error correction encoder algorithm and at least one other matrix element based on a hard decision error correction encoder algorithm; and writing, by the controller, the half product code to the memory.

Example 19 includes the subject matter of Example 18, and wherein encoding the data with a half product code that includes at least one matrix element based on a soft decision error correction encoder algorithm comprises generating the at least one matrix element with a convolutional code.

Example 20 includes the subject matter of any of Examples 18 and 19, and wherein generating the at least one matrix element with a convolutional code comprises performing a continuous convolutional encode over a plurality of rows of the matrix without termination of a trellis until a last row of the plurality of rows is encoded.

Example 21 includes the subject matter of any of Examples 18-20, and wherein generating the at least one matrix element with a convolutional code comprises performing a tail-biting convolutional encode of the data.

Example 22 includes the subject matter of any of Examples 18-21, and wherein encoding the data with a half product code that includes at least one matrix element based on a soft decision error correction encoder algorithm comprises encoding associated rows and columns of the matrix with the soft decision error correction encoder algorithm.

Example 23 includes the subject matter of any of Examples 18-22, and wherein encoding the data with a half product code that includes at least one other matrix element based on a hard decision error correction encoder algorithm comprises generating the at least one other matrix element with a BCH encoder algorithm.

Example 24 includes the subject matter of any of Examples 18-23, and wherein encoding the data with a half product code that includes at least one matrix element based on a hard decision error correction encoder algorithm comprises encoding associated rows and columns of the matrix with the hard decision error correction encoder algorithm.

Example 25 includes the subject matter of any of Examples 18-24, and further comprising determining, by the controller, a cyclic redundancy check (CRC) checksum of the data; and writing, by the controller, the CRC checksum to the memory in association with the data.

Example 26 includes the subject matter of any of Examples 18-25, and further comprising receiving, by the controller, a read request for the data; reading, by the controller and in response to the request, the half product code from the memory; and decoding, by the controller, the half product code to reconstruct the data.

Example 27 includes the subject matter of any of Examples 18-26, and wherein decoding the half product code comprises decoding, by the controller, a first subset of the matrix with a soft decision decoder algorithm; and decoding, by the controller, a second subset of the matrix that was encoded with a hard decision encoder algorithm.

Example 28 includes the subject matter of any of Examples 18-27, and wherein decoding the first subset of the matrix with a soft decision decoder algorithm comprises decoding the first subset with a Viterbi algorithm.

Example 29 includes the subject matter of any of Examples 18-28, and wherein decoding the second subset of the matrix comprises decoding the second subset with a Chase decoder algorithm with soft information from the Viterbi algorithm as an input.

Example 30 includes the subject matter of any of Examples 18-29, and wherein decoding the half product code comprises performing a list decode to generate a plurality of decoded words; comparing each of the plurality of decoded words to a CRC checksum stored in association with the data to determine which of plurality of decoded words has the least amount of flipped bits; and selecting the decoded word with the least amount of flipped bits as the result of the decode.

Example 31 includes the subject matter of any of Examples 18-30, and wherein encoding the data with a half product code that includes at least one other matrix element based on a hard decision error correction encoder algorithm comprises generating the at least one other matrix element with a BCH encoder algorithm with a t value of 3.

Example 32 includes the subject matter of any of Examples 18-31, and wherein encoding the data with a half product code that includes at least one other matrix element based on a soft decision error correction encoder algorithm comprises generating the at least one other matrix element with a convolutional encoder algorithm with an input rate parameter of 16, an output rate parameter of 17, a free distance of 3, and a memory of 5.

Example 33 includes the subject matter of any of Examples 18-32, and wherein encoding the data comprises encoding a 16 kilobyte block of data.

Example 34 includes one or more machine-readable storage media comprising a plurality of instructions stored thereon that, when executed, cause an apparatus to perform the method of any of Examples 18-33.

Example 35 includes the subject matter of Example 34, and an apparatus comprising means for obtaining data to write to a memory of the apparatus; means for encoding the data with a half product code to define a matrix that includes at least one matrix element based on a soft decision error correction encoder algorithm and at least one other matrix element based on a hard decision error correction encoder algorithm; and means for writing the half product code to the memory.

Example 36 includes the subject matter of any of Examples 34 and 35, and wherein the means for encoding the data with a half product code that includes at least one matrix element based on a soft decision error correction encoder algorithm comprises means for generating the at least one matrix element with a convolutional code.

Example 37 includes the subject matter of any of Examples 34-36, and wherein the means for generating the at least one matrix element with a convolutional code comprises means for performing a continuous convolutional encode over a plurality of rows of the matrix without termination of a trellis until a last row of the plurality of rows is encoded.

Example 38 includes the subject matter of any of Examples 34-37, and wherein the means for generating the at least one matrix element with a convolutional code comprises means for performing a tail-biting convolutional encode of the data.

Example 39 includes the subject matter of any of Examples 34-38, and wherein the means for encoding the data with a half product code that includes at least one matrix element based on a soft decision error correction encoder algorithm comprises means for encoding associated rows and columns of the matrix with the soft decision error correction encoder algorithm.

Example 40 includes the subject matter of any of Examples 34-39, and wherein the means for encoding the data with a half product code that includes at least one other matrix element based on a hard decision error correction encoder algorithm comprises means for generating the at least one other matrix element with a BCH encoder algorithm.

Example 41 includes the subject matter of any of Examples 34-40, and wherein the means for encoding the data with a half product code that includes at least one matrix element based on a hard decision error correction encoder algorithm comprises means for encoding associated rows and columns of the matrix with the hard decision error correction encoder algorithm.

Example 42 includes the subject matter of any of Examples 34-41, and further comprising means for determining a cyclic redundancy check (CRC) checksum of the data; and means for writing the CRC checksum to the memory in association with the data.

Example 43 includes the subject matter of any of Examples 34-42, and further comprising means for receiving a read request for the data; means for reading, in response to the request, the half product code from the memory; and means for decoding the half product code to reconstruct the data.

Example 44 includes the subject matter of any of Examples 34-43, and wherein the means for decoding the half product code comprises means for decoding a first subset of the matrix with a soft decision decoder algorithm; and means for decoding a second subset of the matrix that was encoded with a hard decision encoder algorithm.

Example 45 includes the subject matter of any of Examples 34-44, and wherein the means for decoding the first subset of the matrix with a soft decision decoder algorithm comprises means for decoding the first subset with a Viterbi algorithm.

Example 46 includes the subject matter of any of Examples 34-45, and wherein the means for decoding the second subset of the matrix comprises means for decoding the second subset with a Chase decoder algorithm with soft information from the Viterbi algorithm as an input.

Example 47 includes the subject matter of any of Examples 34-46, and wherein the means for decoding the half product code comprises means for performing a list decode to generate a plurality of decoded words; means for comparing each of the plurality of decoded words to a CRC checksum stored in association with the data to determine which of plurality of decoded words has the least amount of flipped bits; and means for selecting the decoded word with the least amount of flipped bits as the result of the decode.

Example 48 includes the subject matter of any of Examples 34-47, and wherein the means for encoding the data with a half product code that includes at least one other matrix element based on a hard decision error correction encoder algorithm comprises means for generating the at least one other matrix element with a BCH encoder algorithm with a t value of 3.

Example 49 includes the subject matter of any of Examples 34-48, and wherein the means for encoding the data with a half product code that includes at least one other matrix element based on a soft decision error correction encoder algorithm comprises means for generating the at least one other matrix element with a convolutional encoder algorithm with an input rate parameter of 16, an output rate parameter of 17, a free distance of 3, and a memory of 5.

Example 50 includes the subject matter of any of Examples 34-49, and wherein the means for encoding the data comprises means for encoding a 16 kilobyte block of data.

The invention claimed is:

1. An apparatus comprising:
    a memory; and
    a controller to manage read and write operations of the memory, wherein the controller is to:
        obtain, in response to a write request, data to write to the memory;
        encode the data with a half product code to define a matrix that includes at least one matrix element based on a soft decision error correction encoder algorithm and at least one other matrix element based on a hard decision error correction encoder algorithm;
        write the half product code to the memory;
        receive a read request for the data;
        read, in response to the read request, the half product code from the memory; and
        decode the half product code to reconstruct the data, wherein to decode the half product code includes to generate a plurality of decoded words, compare each of the plurality of decoded words to a cyclic redundancy check (CRC) checksum stored in association with the data to determine which of the plurality of decoded words has a least amount of flipped bits, and select the decoded word with the least amount of flipped bits as the result of the decode.

2. The apparatus of claim 1, wherein to encode the data with a half product code that includes at least one matrix element based on a soft decision error correction encoder algorithm comprises to generate the at least one matrix element with a convolutional code.

3. The apparatus of claim 2, wherein to generate the at least one matrix element with a convolutional code comprises to perform a continuous convolutional encode over a plurality of rows of the matrix without termination of a trellis until a last row of the plurality of rows is encoded.

4. The apparatus of claim 2, wherein to generate the at least one matrix element with a convolutional code comprises to perform a tail-biting convolutional encode of the data.

5. The apparatus of claim 1, wherein to encode the data with a half product code that includes at least one matrix element based on a soft decision error correction encoder algorithm comprises to encode associated rows and columns of the matrix with the soft decision error correction encoder algorithm.

6. The apparatus of claim 1, wherein to encode the data with a half product code that includes at least one other matrix element based on a hard decision error correction encoder algorithm comprises to generate the at least one other matrix element with a BCH encoder algorithm.

7. The apparatus of claim 1, wherein to encode the data with a half product code that includes at least one matrix element based on a hard decision error correction encoder algorithm comprises to encode associated rows and columns of the matrix with the hard decision error correction encoder algorithm.

8. The apparatus of claim 1, wherein the controller is further to:
    determine a cyclic redundancy check (CRC) checksum of the data; and
    write the CRC checksum to the memory in association with the data.

9. The apparatus of claim 1, wherein to decode the half product code comprises to:
    decode a first subset of the matrix with a soft decision decoder algorithm; and
    decode a second subset of the matrix that was encoded with a hard decision encoder algorithm.

10. The apparatus of claim 9, wherein to decode the first subset of the matrix with a soft decision decoder algorithm comprises to decode the first subset with a Viterbi algorithm.

11. The apparatus of claim 10, wherein to decode the second subset of the matrix comprises to decode the second subset with a Chase decoder algorithm with soft information from the Viterbi algorithm as an input.

12. The apparatus of claim 1, further comprising one or more of:
    at least one processor communicatively coupled to the memory, a network interface communicatively coupled to a processor, a display communicatively coupled to a processor, or a battery coupled to the apparatus.

13. One or more non-transitory machine-readable storage media comprising a plurality of instructions stored thereon that, when executed, cause an apparatus to:

obtain, by a controller of the apparatus, data to write to a memory of the apparatus;

encode, by the controller, the data with a half product code to define a matrix that includes at least one matrix element based on a soft decision error correction encoder algorithm and at least one other matrix element based on a hard decision error correction encoder algorithm;

write, by the controller, the half product code to the memory;

receive a read request for the data;

read, in response to the read request, the half product code from the memory; and decode the half product code to reconstruct the data, wherein to decode the half product code includes to generate a plurality of decoded words, compare each of the plurality of decoded words to a cyclic redundancy check (CRC) checksum stored in association with the data to determine which of the plurality of decoded words has a least amount of flipped bits, and select the decoded word with the least amount of flipped bits as the result of the decode.

14. The one or more non-transitory machine-readable storage media of claim 13, wherein to encode the data with a half product code that includes at least one matrix element based on a soft decision error correction encoder algorithm comprises to generate the at least one matrix element with a convolutional code.

15. The one or more non-transitory machine-readable storage media of claim 14, wherein to generate the at least one matrix element with a convolutional code comprises to perform a continuous convolutional encode over a plurality of rows of the matrix without termination of a trellis until a last row of the plurality of rows is encoded.

16. The one or more non-transitory machine-readable storage media of claim 14, wherein to generate the at least one matrix element with a convolutional code comprises to perform a tail-biting convolutional encode of the data.

17. The one or more non-transitory machine-readable storage media of claim 13, wherein to encode the data with a half product code that includes at least one matrix element based on a soft decision error correction encoder algorithm comprises to encode associated rows and columns of the matrix with the soft decision error correction encoder algorithm.

18. The one or more non-transitory machine-readable storage media of claim 13, wherein to encode the data with a half product code that includes at least one other matrix element based on a hard decision error correction encoder algorithm comprises to generate the at least one other matrix element with a BCH encoder algorithm.

19. The one or more non-transitory machine-readable storage media of claim 13, wherein to encode the data with a half product code that includes at least one matrix element based on the hard decision error correction encoder algorithm comprises to encode associated rows and columns of the matrix with the hard decision error correction encoder algorithm.

20. A method comprising:

obtaining, by a controller of an apparatus, data to write to a memory of the apparatus;

encoding, by the controller, the data with a half product code to define a matrix that includes at least one matrix element based on a soft decision error correction encoder algorithm and at least one other matrix element based on a hard decision error correction encoder algorithm;

writing, by the controller, the half product code to the memory;

receiving, by the controller, a read request for the data;

reading, by the controller and in response to the read request, the half product code from the memory; and decoding, by the controller, the half product code to reconstruct the data, including generating a plurality of decoded words, comparing each of the plurality of decoded words to a cyclic redundancy check (CRC) checksum stored in association with the data to determine which of the plurality of decoded words has a least amount of flipped bits, and selecting the decoded word with the least amount of flipped bits as the result of the decode.

21. The method of claim 20, wherein encoding the data with a half product code that includes at least one matrix element based on a soft decision error correction encoder algorithm comprises generating the at least one matrix element with a convolutional code.

22. The method of claim 21, wherein generating the at least one matrix element with a convolutional code comprises performing a continuous convolutional encode over a plurality of rows of the matrix without termination of a trellis until a last row of the plurality of rows is encoded.

23. The method of claim 21, wherein generating the at least one matrix element with a convolutional code comprises performing a tail-biting convolutional encode of the data.

* * * * *